United States Patent
Giuroiu

[11] Patent Number: 5,726,652
[45] Date of Patent: Mar. 10, 1998

[54] DIGITAL TO ANALOG CONVERTER LINEARITY WITH MISMATCHED CURRENT SOURCES

[75] Inventor: Horia Giuroiu, Singapore, Singapore

[73] Assignee: Tritech Microelectronics, Inc.

[21] Appl. No.: 665,333

[22] Filed: Jun. 17, 1996

[51] Int. Cl.[6] .................................................. H03M 1/78
[52] U.S. Cl. ............................................ 341/154; 341/118
[58] Field of Search ..................................... 341/118, 154

[56] References Cited

U.S. PATENT DOCUMENTS

| 4,034,366 | 7/1977 | Memishian, Jr. |         |
|-----------|--------|----------------|---------|
| 5,036,322 | 7/1991 | Barrow et al.  | 341/144 |

*Primary Examiner*—Marc S. Hoff
*Attorney, Agent, or Firm*—George O. Saile; Stephen B. Ackerman

[57] ABSTRACT

The linearity of a digital to analog converter is greatly enhanced by applying the same current to each of the nodes of a R-2R ladder network. This is accomplished by breaking the conversion cycle into n time slots and sequencing the connection of the current sources such that each will be connected to a different node in each of the time slots. In this way all the current sources will be connected to each node once in the conversion cycle and the current flowing into the each node will be the average value of all of the currents. Since each node receives this same average current, the linearity of the digital to analog converter is enhanced and is not a function of the mismatch of the applied current sources.

11 Claims, 3 Drawing Sheets

DIGITAL TO ANALOG CONVERTER LINEARITY WITH MISMATCHED CURRENT SOURCES

BACKGROUND OF THE INVENTION

1. Field of the Invention

The invention relates to the tolerance differences between current sources in an a digital to analog converter employing the use of R-2R ladder networks. These current differences affect the linearity of the output of this type of converter. This invention demonstrates how to reduce the differences between current generators without adjustments while dramatically improving the linearity performance of digital to analog converters of the type using R-2R ladder networks.

2. Description of Related Art

The linearity performance of digital to analog converters (DAC's) are greatly affected by variations in circuit items which are not common to the total signal flow. These circuit items include the current sources, ladder network resistors and the different ground reference points between the ladder network and the output amplifier. One way to obtain the desired linearity is to adjust the current sources to be identical, trim the similar resistors to have the same value and make the ground or reference leg of the ladder network be the same as the current summing operational amplifier. Whereas, this will produce the desired results it is expensive.

Referring to U.S. Pat. No. 5,036,322 (Barrow et al.), the variation between current sources has been reduced by developing the knowledge of the variability of the manufactured current sources over a statistically significant product sample. Then apply this knowledge to constructing a desired accurate current source from the summation of several smaller and less accurate current sources. In this way producing a final current source of larger magnitude and having a smaller variability than the individual current sources that make up the final current source. In today's world of integrated circuits the tracking of variations on a single device may need to be taken into consideration. Tight tracking between like elements of a semiconductor device is desirable, but it can provide a source of yield loss when the particular devices line up near the acceptable limits and all have closely the same value. The mean value in this case would be off from the expected nominal value predicted from variations across several devices.

When the ground reference between the ladder network and the current summing amplifier are different, the voltages at the nodes can affect the currents flowing in the ladder network. Thus causing an inaccuracy in the final voltage of the digital to analog converter. Making the two references electrically the same is difficult because of lead resistance and variations in ground reference current from DAC input signal to input signal. Referring to U.S. Pat. No. 4,034,366 (Memishian), one method used to correct this problem is to sense the R-2R ladder network ground reference, compare it to the reference of the current summing amplifier and adjust the ground reference of the ladder network to be the same for various current generator inputs.

SUMMARY OF THE INVENTION

In a digital to analog converter using a R-2R ladder network the mismatch of current sources is one of the causes of non-linearity of the analog signal output. Matching the number of current sources in such a converter can be more difficult than matching the resistors in the ladder network. This invention uses a novel approach to improving current matching from a set of unmatched current sources. The basic idea is to connect every current source to each node of the ladder network during the conversion to an analog signal. In this way all nodes will see the same current depending on the corresponding bit value (1or 0) of the digital input. In this way the currents can be averaged together and all nodes corresponding to the same bit value will receive the same current. The averaging is accomplished by closing each switch connecting the current sources to a different node of the R-2R network for 1/nth of the conversion cycle. Where "n" is the number of bits in the digital input to the DAC. For every input bit equaling a logical "1" the current into the corresponding node of the R-2R ladder network will be $$\frac{I_1 + I_2 + \ldots I_n}{n}$$

otherwise the current is zero. A sequencer is used to cycle the connection of the current sources to the various nodes of the ladder network, and a low pass filter network built with an operational amplifier averages the currents to provide a smoothed output. In this way the invention provides a means to feed each node of a R-2R ladder network with the same current and producing improved output linearity. Because there is a finite time in which to produce a valid output of the DAC, the minimum time to complete a conversion can be longer than other techniques. However, the other techniques may be more difficult and costly to produce the same results.

BRIEF DESCRIPTION OF DRAWINGS

This invention will be described with reference to the accompanying drawings, wherein.

DESCRIPTION OF THE PREFERRED EMBODIMENT

Figure 1:
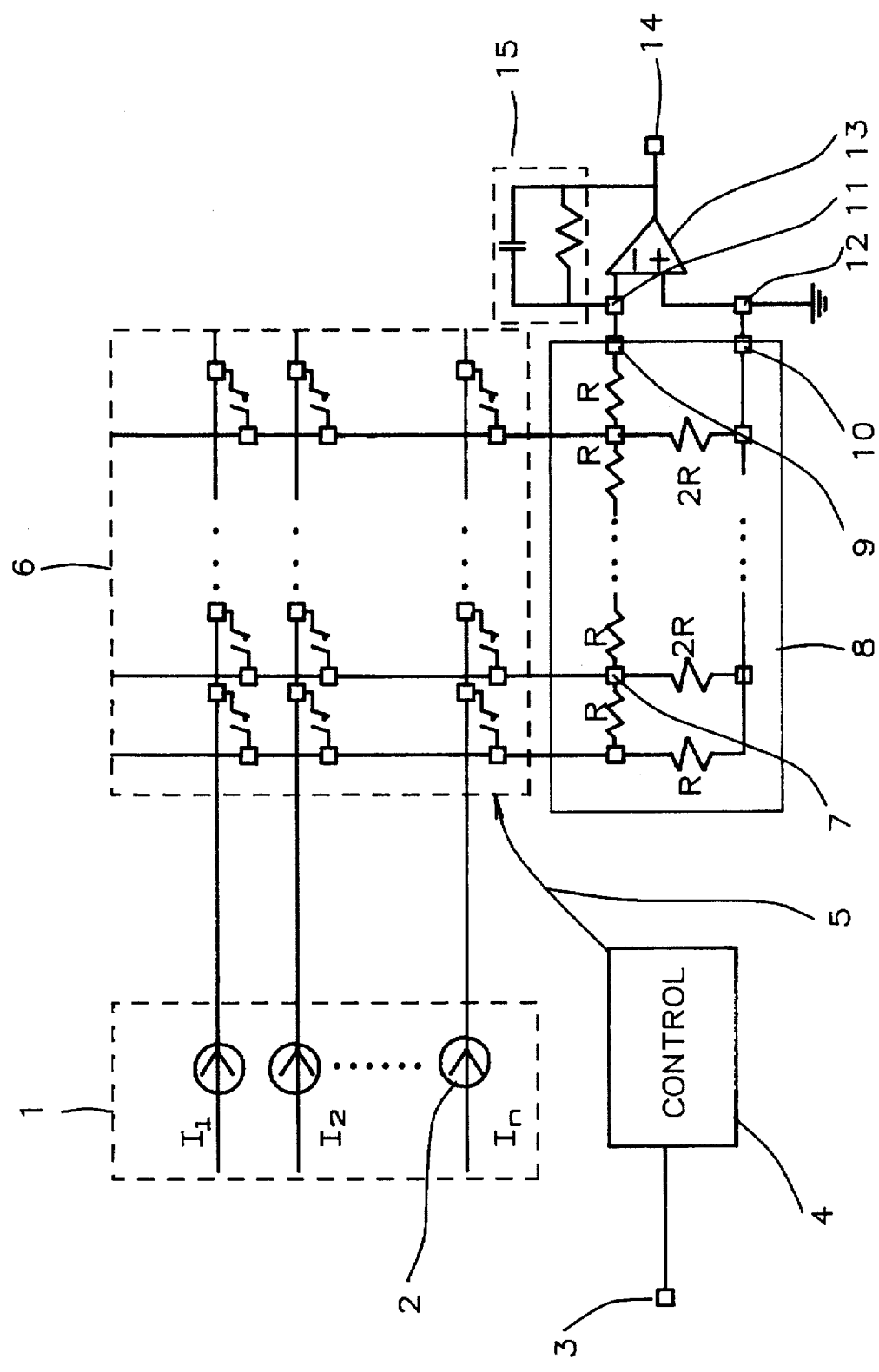
FIG. 1 is a schematic of a digital to analog converter according to the invention.

Referring to FIG. 1, a DAC is shown in accordance with the invention. There is a set of current sources 1 having a number of independent sources typified by 2, varying in quantity depending on the resolution of the DAC, and equal to the number of binary bits in the digital data input 3. Digital data input 3 is connected to control block 4 which represents a collection of logic circuits that are to control and sequence a set of switches 6 through the block output 5. The set of switches 6 connects the set of current sources 1 to the nodes typified by 7 of an R-2R ladder network 8. The set of switches 6 is arranged in row and columns. There is one row for every independent current source typified by 2. Similarly there is one column of switches for every ladder node typified by 7. The switches connect the rows to the columns, and therefore, connect the set of current sources 1 to the nodes of the ladder network 8. Typically there are 8 bits in the binary input 3 but not restricted to this number. Thus there are typically eight independent current sources 2 and eight network nodes 7, which can be greater or less in number depending on the desired resolution of the DAC. The outputs 9 and 10 of the ladder network 8 are connected to the inputs nodes 11 and 12 of a current summing operational amplifier 13 and low pass filter 15. The output 14 of the amplifier is also the output of the DAC and is fed back through a resistor and capacitor of the low pass filter 15. As known to those schooled in the art of operational amplifier design, the feedback maintains the two input nodes 11 and 12 at equal potential and produces a voltage at output 14 which is proportional to the current flowing into the amplifier input node 11.

Figure 2:
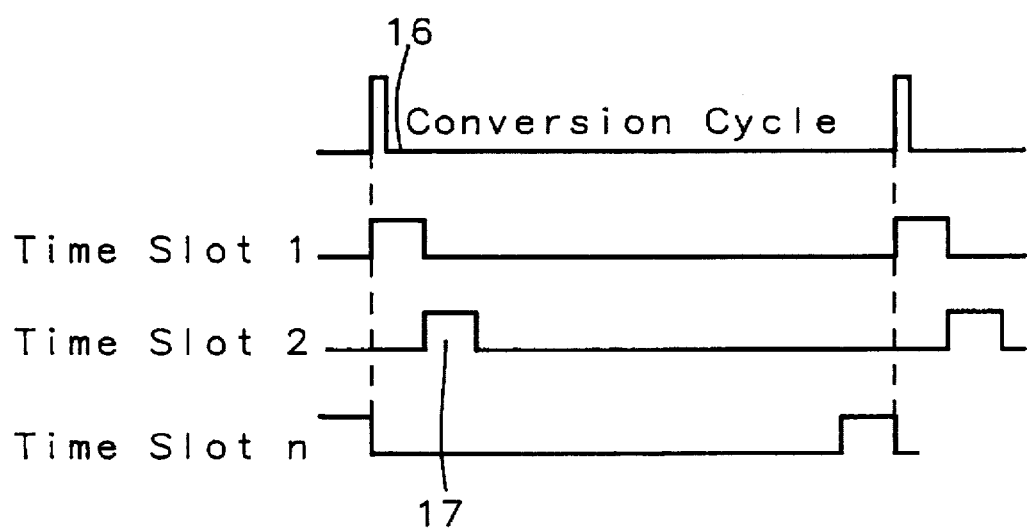
FIG. 2 shows the sequenced timing of the of the conversion cycle according to the invention.

Referring to FIG. 2, the sequencing and control circuitry contained within block 4 divides the conversion cycle 16 into a number of time slots typified by 17. The number of time slots are equal to the number of current sources typified by 2 in FIG. 1. During each time slot a different current source typified by 2 is connected through the set of switches 6 to different ladder network nodes typified by 7. This is done such that there is an exclusive connection of only one current source typified by 2 connected to only one node typified by 7 at the same time. When the last time slot typified by 17 in the conversion cycle 16 is completed, each current source typified by 2 will have been connected once to each ladder network node typified by 7. In addition the current connected to each node typified by 7 during each time slot will be further controlled to be on or off depending on the value of the corresponding digital bit of the digital input 3. This results in a current flowing between the ladder network output 9 and the operational amplifier input 11 that is a function of the average value of all of the current sources contained within 1 and proportional to the binary value of the digital input 3.

Figure 3A:
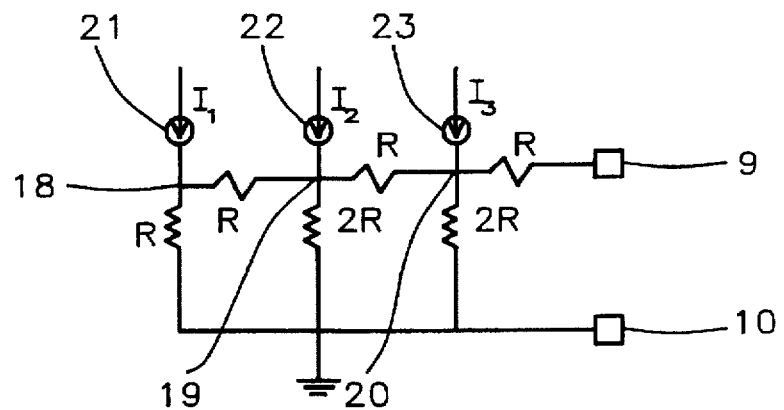
FIG. 3 is a diagrammatic example of the sequence of current sources connected to each of the ladder network nodes according to the invention.
Figure 3B:
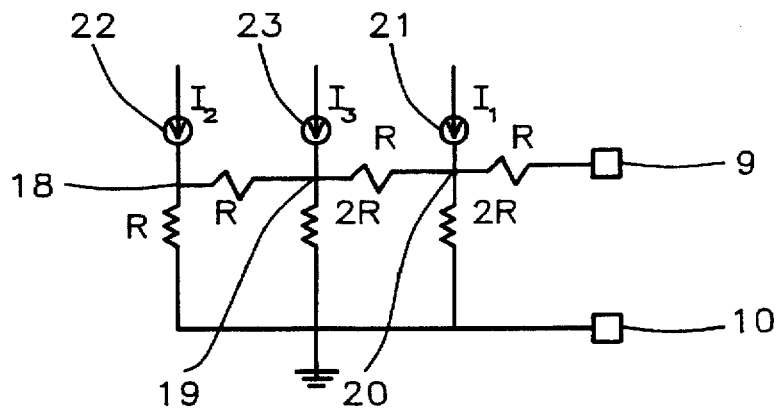
Figure 3C:
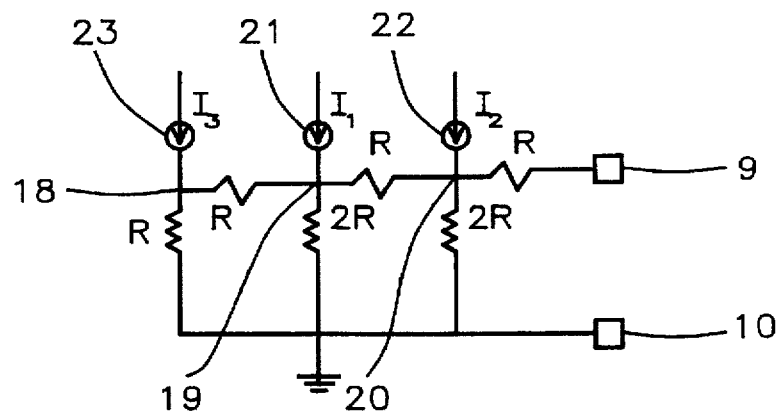

To further aid in the understanding of this invention, shown in FIG. 3 are equivalent circuit diagrams for each of the three time slots needed for a three binary bit DAC input 3. The required three ladder network nodes 18, 19, and 20 are connected to each of the three current sources in a different time slot as shown in FIG. 3a, FIG. 3b and FIG. 3c. The current connected to node 18 for the total conversion cycle 16 is the sum of 21, 22 and 23 divided by three. The adjustment by dividing by three is because each time slot is valid for one third of the conversion cycle and each current 21, 22 and 23 are only applied to each node for one third of the time. Similarly the currents for nodes 19 and 20 are also the sum of 21, 22 and 23 divided by 3. Thus identical currents are applied to each node improving the linearity of the converter without having to adjust each individual current source 21, 22 and 23.

While the invention has been particularly shown and described with reference to preferred embodiments thereof, it will be understood by those skilled in the art that various changes in form and details may be made without departing from the spirit and scope of the invention.

What is claimed is:

1. A digital to analog converter (DAC) comprising:
   a) a digital controller and sequencer, a set of current generators, a set of switches, an R-2R ladder network and a low pass filter,
   b) digital signal input connected to the digital controller and having a number "n" digital data bits representing the digital value of the amplitude of analog signal output,
   c) said controller and sequencer connected to and controlling the switch state of said set of switches,
   d) said set of switches connecting a number "n" current generators to a number "n" nodes of said R-2R ladder network in a fashion as to produce an analog output current proportional to the digital input signal,
   e) the output of said R-2R ladder network being connected to an operational amplifier such that the input reference of the amplifier is the same as the reference leg of the R-2R ladder network.
   f) said sequencer controlling the timed selection and activation of each switch,
   g) said activation of each switch connecting the current of the current generators to the nodes of the R-2R ladder network,
   h) said activation of each switch connecting the current of only one current generator to each node of the R-2R ladder network at a time,
   i) each current source being connected in a sequential fashion to each of the nodes of the R-2R ladder network,
   j) the sequential fashion of connecting currents to the R-2R ladder network repeated after the last current source connected to last node of said ladder network.

2. The digital to analog converter of claim 1 wherein the magnitude of the current generators is the same from current generator to current generator within an allowable tolerance.

3. The digital to analog converter of claim 1 wherein the current connected to each node is controlled on, or off, depending on the value of the corresponding bit of the digital input signal being a logical "1", or "0".

4. The digital to analog converter of claim 1 wherein the repeated sequencing of the connection of current generators to the ladder network creates an averaging effect to produce a more linear output of the DAC.

5. The digital to analog converter of claim 1 wherein the set of switches are arranged in a matrix of columns and rows, and comprising:
   a) said current generators being connected to said rows and the nodes of the R-2R ladder network being connected to said columns,
   b) each node of the ladder network representing a different data bit of the digital signal input,
   b) said sequencer and controller connecting one switch in each row to a different column,
   c) said sequencer and controller preventing more than one switch from being connected to a column at a time,
   d) said sequencer and controller enabling each row of switches connected to the current generators to be on, or off, depending on the state of each corresponding data bit of the digital signal input.

6. The switch matrix of claim 5 wherein current generators are connected to columns and nodes of the R-2R ladder network are connected to rows, and comprising:
   a) said sequencer and controller connecting one switch in each column to a different row,
   b) said sequencer and controller preventing more than one switch to be connected to a row at a time,
   d) said sequencer and controller enabling each column of switches connected to the current generators to be on, or off, depending on the state of each corresponding data bit of the digital signal input.

7. A linear digital to analog converter (DAC) with a set of current generators having a nominal value and a variance within some tolerance, and comprising:
   a) a conversion cycle divided into time slots to translate the digital input signal into an analog signal,
   b) a connection of each current generator made to a different node of an R-2R ladder network during a time slot,
   c) the connection of each current generator made in sequence to each node of the R-2R ladder network,
   d) said connections made such that all nodes of said ladder network are connected to a different current generator each time slot in a conversion cycle.

e) each current generator connection is enabled to be on, or off, depending on the value of data bits in the digital input signal to the DAC, f) a connection sequence repeated after each current generator has been connected to each node of said ladder network, g) said connection sequence controlled by digital controls in the input circuitry of the DAC, h) variation of the R-2R ladder network output currents in each time slot caused by variations in current from the current generators is integrated by the low pass filter to provide a more linear output.

8. The digital to analog converter of claim 7 wherein each R-2R ladder network node receives the same amount of current as summed over a conversion cycle depending on the bit of the DAC input digital signal, and comprising:

a) a digital controller and sequencer connected to a matrix of switches, b) each switch connecting a current generator to a node of the R-2R ladder network, c) each switch enabled to be activated depending on the value of the corresponding bit in the digital input of the DAC, d) a bit value of "1" enabling the switch and a bit value of "0" disabling the switch, e) each current generator is connected in sequence through enabled switches to each ladder network node during different time slots of the conversion cycle.

9. The digital to analog converter of claim 8 wherein the current generators are enabled or disabled depending on the value of the corresponding bit in the digital input signal to the DAC, and comprising:

a) each current generator connected in sequence to each node of the R-2R ladder network during different time slots, b) each current generator is disabled when connected to a R-2R ladder network node corresponding to a bit position in the digital input signal having a value of a logical "0".

10. A digital to analog converter (DAC) having a timed and subdivided conversion cycle, and comprising:

a) said conversion cycle subdivided into an equal number of time slots with the total number of time slots being equal to "n" the number of data bits of the input digital signal to the DAC, b) each node of an R-2R ladder network connected to a different set of switches that are enable or disabled depending on the value of a the corresponding input data bit, c) a different set of current generators connected to each node of an R-2R ladder network during each time slot of the conversion cycle depending on the switches connected to a node being enabled, d) each current generator producing a current with a similar value within some tolerance, e) all current generators connected to each ladder network node during a conversion cycle depending on switches being enabled, f) an output current from the said ladder network being the result of all current generators applied to each node connected to enabled switches during a conversion cycle, g) a low pass filter connected to the output of the ladder network averages the current resulting from the connection of different current generators to different nodes during the conversion cycle.

11. The digital to analog converter of claim 10 wherein the current generators are enabled or disabled during each time slot depending upon the value of a corresponding bit on the input digital signal.

* * * * *